US006031179A

United States Patent [19]

O'Neill

[11] Patent Number: 6,031,179

[45] Date of Patent: Feb. 29, 2000

[54] COLOR-MIXING LENS FOR SOLAR CONCENTRATOR SYSTEM AND METHODS OF MANUFACTURE AND OPERATION THEREOF

[75] Inventor: Mark J. O'Neill, Keller, Tex.

[73] Assignee: Entech, Inc., Keller, Tex.

[21] Appl. No.: 08/854,230

[22] Filed: May 9, 1997

[51] Int. Cl.[7] .......................... H01L 31/052; G02B 3/08; G02B 5/04

[52] U.S. Cl. .......................... 136/246; 136/259; 126/680; 126/698; 126/700; 250/227.11; 250/216; 359/742; 359/831; 359/834; 359/837; 438/57; 438/64; 438/66

[58] Field of Search .................................... 136/246, 259; 126/680, 698, 700; 250/227.11, 216; 359/742, 831, 834, 837; 438/57, 64, 66

[56] References Cited

U.S. PATENT DOCUMENTS 3,969,746 7/1976 Kendall et al. .
3,985,579 10/1976 Rahilly .
4,042,417 8/1977 Kaplow et al. .
4,070,205 1/1978 Rahilly .
4,082,568 4/1978 Lindmayer .
4,082,570 4/1978 House et al. .
4,204,881 5/1980 McGrew ................................ 136/246
4,295,002 10/1981 Chappell et al. ....................... 136/244
4,312,330 1/1982 Holdridge .............................. 136/246
4,335,503 6/1982 Evans, Jr. et al. .
4,341,918 7/1982 Evans, Jr. et al. ...................... 136/249
4,376,872 3/1983 Evans et al. ........................... 136/249
4,844,598 7/1989 Mori ....................................... 359/742
5,053,083 10/1991 Sinton .................................... 136/256
5,498,297 3/1996 O'Neill et al. ......................... 136/246

*Primary Examiner*—Alan Diamond
*Attorney, Agent, or Firm*—Sankey & Luck, L.L.P.

[57] ABSTRACT

A color-mixing lens for use in a concentrator system and methods of manufacture and operation thereof. The color-mixing lens includes: (1) a light-transmissive substrate that receives broad spectrum light from a source, (2) a first plurality of prisms, located on the substrate, that refract and chromatically disperse the light received therein toward a first plurality of locations on an active region of a target cell, and (3) a second plurality of prisms located on the substrate that refract and chromatically disperse the light received therein toward a second plurality of locations on the active region. Relative dimensions of the first and second pluralities of prisms are preselected to cause the chromatically-dispersed light to mix and thereby increase a power output of the target cell by reducing inter-junction currents therein.

33 Claims, 4 Drawing Sheets

110
100
130
120

110
100
130
120

240
240
240
230
210
100
250
250
250

226
222
220
224

240
240
240
530
530
510
100
532
532
550
550
550

522
520
222
220
224

35
30
25
20
15
10
5
0
PHOTOCURRENT IN SUNS
602
604
600
LEGEND:
TOP JUNCTION
BOTTOM JUNCTION
LATERAL POSITION ACROSS 0.94cm WIDE CELL

700
LEGEND:
RED-EDGE LENS
COLOR-MIXING LENS
710
720
CHROMATIC ABERRATION FRACTIONAL POWER LOSS (PERCENT)
0
2
4
6
8
10
12
14
16
SHEET RESISTANCE BETWEEN THE JUNCTIONS (OHMS/SQUARE)
0
100
200
300
400
500

COLOR-MIXING LENS FOR SOLAR CONCENTRATOR SYSTEM AND METHODS OF MANUFACTURE AND OPERATION THEREOF

TECHNICAL FIELD OF THE INVENTION

The present invention is directed, in general, to solar energy and, more specifically, to a color-mixing lens in a concentrator system that increases a power output of a monolithic multi-junction ("MMJ") solar cell therein.

BACKGROUND OF THE INVENTION

Solar energy for Earthbound applications continues to be an area of intense design effort because of its environmental friendliness. In space-based applications, the abundance and permanence of sunlight makes solar energy particularly attractive.

Broadly speaking, two solar-cell-based systems exist today for generating electricity from light. The first takes the form of flat panel solar arrays. In such arrays, light (typically received from the Sun) impinges directly upon solar cells in the array, without concentration or other amplification.

The second system generally in use is called a concentrator system. In concentrator systems, optical elements concentrate light before it impinges on solar cells. The degree of concentration is frequently quantified in relative terms as a multiplier (such as "10X") or in absolute terms as a number of "suns" (the exact meaning of which is well-known to those skilled in the art). One type of concentrator system is a "line-focus" concentrator system and is characterized by a line-focusing lens, such as a Fresnel lens, that concentrates light received into its area into a narrow ribbon. The concentrated narrow ribbon of light impinges upon an elongated solar cell or linear array of such solar cells.

Solar cell technology is also increasing in sophistication.

One example of a new breed of solar cell is a monolithic multi-junction ("MMJ") cell. "Monolithic" means that such cells are formed upon or within a single, semiconductor substrate, which may be composed of gallium arsenide ("GaAs") or germanium (Ge), much as today's integrated circuits are structured. "Multi-junction" means that the cell is formed in multiple layers ("junctions") within the substrate. Each of the junctions is optimized (by means of a doping process) to absorb light in a given range of frequency. Light that is not absorbed in upper junctions is transmitted to lower junctions for absorption there. Ideally, the junctions in an MMJ cell cooperate to absorb as much energy as physically possible within a given spectrum of light. Most MMJ cells have two junctions, although cells having higher numbers of junctions are now beginning to appear in commercial form. The junctions are coupled together in electrical series to deliver electricity at a single output.

A problem has arisen in pairing line-focused lenses with MMJ cells. The problem stems from chromatic aberration in such lenses that tends to separate the colors in broad-spectrum light (so-called "chromatic dispersion"). Chromatic aberration causes light to be projected onto the MMJ cell in a frequency-dependent manner, degrading the power output of the cell.

The problem can best be illustrated by way of example. If light having laterally dispersed blue (higher frequency) and red (lower frequency) components is projected onto an MMJ cell, the junction optimized for absorbing blue light would respond with electrical current in a different lateral location than would the junction optimized for red light. Because the junctions are coupled in series, the differing junction current locations require lateral currents to flow through the layers between the junctions. This gives rise to two problems. First, the layers between junctions present a significant lateral sheet resistance, impeding conduction of the inter-junction currents dissipating power within the cell. This decreases the efficiency of the MMJ cell significantly. Second, the resulting power dissipation in the cell raises the cell's overall temperature perhaps, in localized spots, to the point that the cell is damaged or destroyed.

Therefore, what is needed in the art is a way of increasing the power output of MMJ cells in concentrator systems.

SUMMARY OF THE INVENTION

To address the above-described deficiencies of the prior art, the present invention provides, for use in a concentrator system, a color-mixing lens, including: (1) a light-transmissive substrate that receives broad spectrum light from a source, (2) a first plurality of prisms, located on the substrate, that refract and chromatically disperse the light received therein toward a first plurality of locations on an active region of a target cell and (3) a second plurality of prisms, located on the substrate, that refract and chromatically disperse the light received therein toward a second plurality of locations on the active region. The first and second pluralities of locations partially merge (remaining offset somewhat with respect to one another) to cause the chromatically-dispersed light to mix and thereby increase a power output of the target cell.

The present invention therefore introduces the broad concept of employing a color-mixing lens to compensate for chromatic aberration introduced by the lens. The compensation, in turn, increases the overall power output of the target cell. Relative dimensions of the first and second pluralities of prisms may be preselected to cause the chromatically-dispersed light to mix. Alternatively, materials for the first and second pluralities of prisms may be chosen such that the relative indices of refraction of the materials cause the chromatically-dispersed light to mix. Those skilled in the art will perceive other ways in which the prisms may be modified to achieve the desired mixing effect.

In one embodiment of the present invention, the first plurality of prisms comprise red-edge prisms. Those skilled in the art understand the structure and operation of red-edge prisms, conventionally employed in conjunction with single-junction cells. In general, such red-edge prisms place infrared photons from the rim of the solar disk at an outer edge of the active-width of the cell when the largest sun-pointing error is present.

In one embodiment of the present invention, the second plurality of prisms comprise red-shifted prisms. The red-shifted prisms project light onto the second plurality of locations, which is shifted with respect to the first plurality of locations to cause the light to mix. The present invention is not limited to a particular magnitude or direction of shift.

In one embodiment of the present invention, the light transmissive substrate is composed of silicone. Silicone has been found to be advantageous in space-based applications. Of course, the present invention is not restricted to a certain composition for the light-transmissive substrate.

In one embodiment of the present invention, the first and second pluralities of locations are spacially offset to minimize the inter-junction lateral current in the target cell. In a more specific embodiment, the first and second pluralities of locations are spacially offset to overlap median-current photons for the various junctions in the target cell.

In an embodiment to be illustrated and described, the median (50%) current photons suggests an effective index of refraction shift between the first and second pluralities of prisms of about 0.01. The present invention advantageously offsets the pluralities of locations to compensate as closely as possible for the spectral current differential between various junctions. However, certain applications may benefit from less-than optimal compensation.

In one embodiment of the present invention, the first and second pluralities of prisms alternate on the substrate. In the embodiment to be illustrated and described, the first and second pluralities of prisms have a fixed height of about 4 mils (thousandths of an inch). Interior angles of the prisms (and therefore the length of their bases) are varied to shift the first and second pluralities with respect to one another. The prisms alternate: a prism of a first type is located between two prisms of a second type, and vice versa.

In one embodiment of the present invention, the target cell is an MMJ cell. Of course, the present invention may be advantageously applied to other cells, especially those having multiple junctions and exhibiting substantial inter-junction lateral currents in the absence of such color-mixing lens.

In one embodiment of the present invention, the light is white light. In a more specific embodiment, the light is sunlight. Of course, the present invention is not limited to white or other naturally-occurring light.

In one embodiment of the present invention, the first and second pluralities of prisms are integral with the substrate. In the embodiment to be illustrated and described, the first and second pluralities of prisms are molded integrally with the substrate in a single manufacturing step. However, such prisms can be formed and mechanically attached (by gluing or the like) to the substrate in separate steps.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
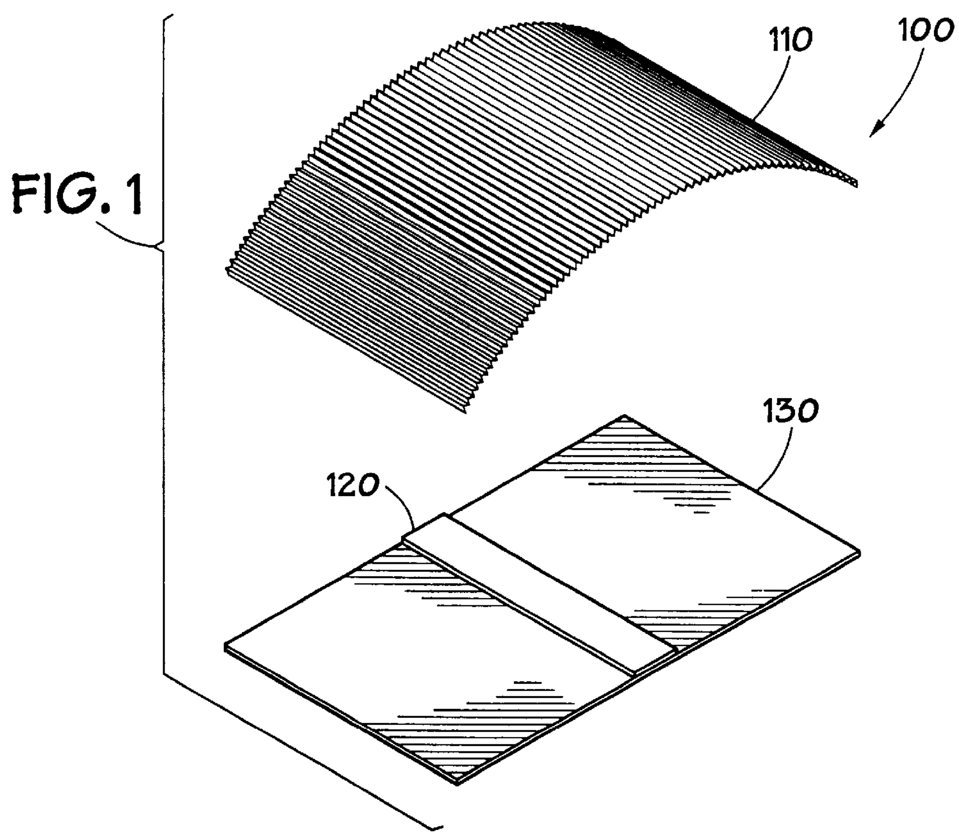
FIG. 1 illustrates an isometric view of a line-focus concentrator system that provides an environment in which the present invention can operate.

Referring initially to FIG. 1, illustrated is an isometric view of a line-focus concentrator system that provides an environment in which the present invention can operate. The concentrator system, generally designated 100, may be employed, for instance, for space power applications. An arched glass/silicone Fresnel lens 110 focuses incident photons onto a photovoltaic receiver containing high-efficiency multi-junction cells ("target cells") 120 arranged in tandem. The target cells 120 can be either mechanically stacked multi-junction ("MSMJ") devices or MMJ devices. However, for purposes of the following discussion, it will be assumed that the target cells 120 are MMJ devices. Optional secondary optics (not shown) can be employed to boost the achievable concentration ratio and to provide radiation shielding of the target cells 120. Waste heat is rejected from the target cells via radiation from a composite or aluminum panel 130 in thermal communication with the target cells 120.

Figure 2:
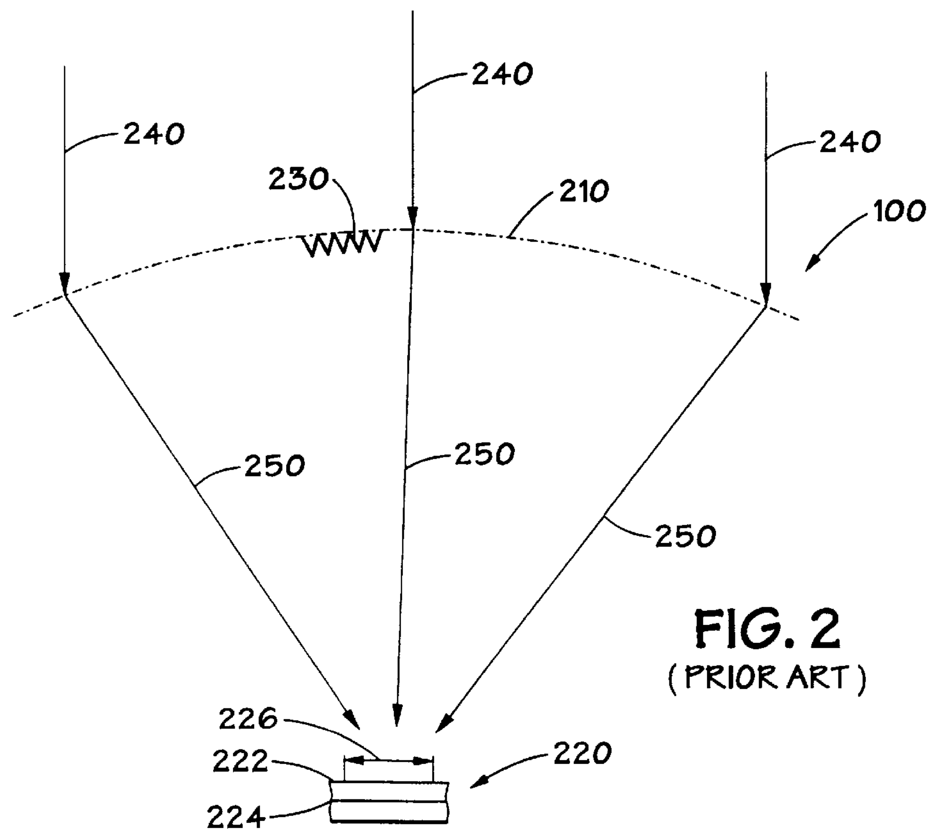
FIG. 2 illustrates a schematic diagram of a prior art lens operating in the line-focus concentrator of FIG. 1.

Turning now to FIG. 2, illustrated is a schematic diagram of the operation of a prior art lens 210 operating in the line-focus concentrator 100 of FIG. 1. The lens 210 comprises a single plurality of prisms 230 that receive rays 240 of broad spectrum light from a source (not shown). For purposes of FIG. 2, it is assumed that the source is sufficiently distant from the lens 210 that the rays 240 of light are essentially parallel, a condition that is safely taken to be true when the source of light is the sun. Individual ones of the single plurality of prisms 230 refract and chromatically disperse the rays 240 toward a target cell 220, resulting in the projection of rays 250 ("refracted rays") that radiate toward a single plurality of locations 226 spanning an active-width of the target cell 220. The single plurality of prisms 230 are illustrated as being of a conventional red-edge design; they place infrared photons emanating in rays 240 from the edge of the source (not shown) at edge of the active-width of the target cell 220 when the largest source-pointing error is present. However, the single plurality of prisms 230 may be designed according to other conventional techniques. It is important to note, however, that the single plurality of prisms 230 do not color-mix; they aim light at a given lateral location on the target cell 220 and, by virtue of chromatic aberration, actually place the light, unmixed, in only a single plurality of locations.

The target cell 220 is illustrated as being an MMJ, with a top junction 222 and a bottom junction 224. The top and bottom junctions 222, 224 are "tuned" to absorb light of different frequencies (usually by means of selective doping). Thus, the refracted rays 250 impinge on the target cell 220, striking the top junction 222 first. The top junction 222 absorbs photons in the refracted rays 250 of the appropriate frequency range and passes all other photons through to the bottom junction 224. When the photons strike the bottom junction 224, those of the appropriate frequency range are absorbed. Any unabsorbed photons in the refracted rays 250 pass through the remainder of the target cell 220 (perhaps to still lower junctions in the case of a more-than-two junction MMJ cell). Depending upon the number of photons absorbed in each of the top and bottom junction 222, 224, each junction develops an electrical current of a given magnitude.

As described above, if the refracted rays contain frequency-dependent amounts of light (such as happens when the lens 210 chromatically disperses the light), the top and bottom junctions 222, 224 absorb photons at differing lateral locations, creating, in turn, a lateral inter-junction current that is caused to flow between the top and bottom junctions 222, 224 through the layers between junctions to compensate for the uneven local current development. Impedance in the layers between junctions causes (1) power dissipation and (2) heat.

Currently, the most efficient MMJ cell is a gallium indium phosphorous/gallium arsenide (GaInP/GaAs) tandem device developed by Olson, et al. of the National Renewable Energy Lab ("NREL"), and currently being produced by Applied Solar Energy Corporation ("ASEC") and Spectrolab.

Figure 3:
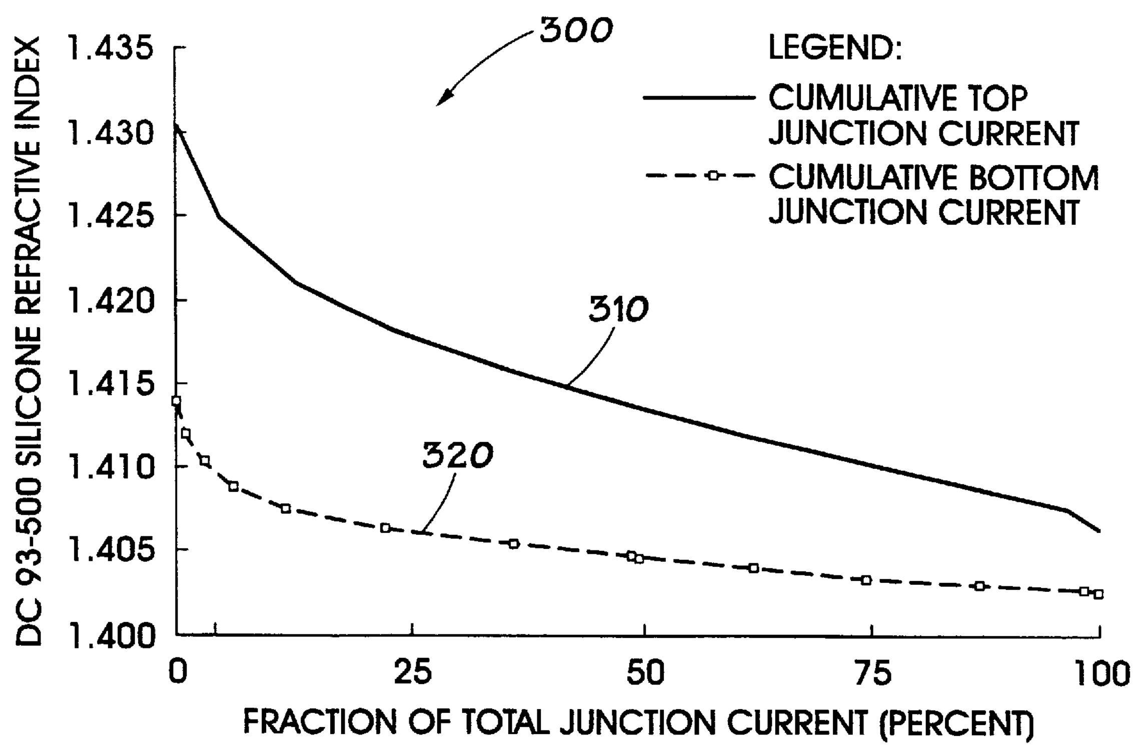
FIG. 3 illustrates a graphical representation of cumulative top and bottom junction currents in an exemplary MMJ cell.

Turning now to FIG. 3, illustrated is a graphical representation (generally designated 300) of cumulative top and bottom junction currents in an exemplary MMJ cell. FIG. 3 illustrates the chromatic aberration problem inherent in the use of refractive optical concentrators with this MMJ cell. Two curves 310, 320 in FIG. 3 result from the convolution of AMO spectral irradiance (photon flux versus wavelength), a dispersion curve of the silicone lens material (refractive index versus wavelength), and the spectral responses of the top and bottom junctions (absorption efficiency versus wavelength for each). Note that the top junction current is produced by shorter wavelength photons which are refracted by the silicone lens material over the refractive index range of 1.407 to 1.4306. Note that the bottom junction current is produced by longer wavelength photons which are refracted by the silicone lens material of the refractive index range of 1.403 to 1.414. The current-weighted average difference in refractive index or the photon-generating current in the two junctions is 0.01. Thus, each prism in the Fresnel lens refracts the top junction photons more strongly than the bottom junction photons, thereby producing the two junction currents at different lateral positions across the solar cell. The lateral current separation distance is least for prisms near the center line of the lens and greatest for prisms near the outer edges of the lens, since this distance depends on the total ray refraction angle as well as the index of refraction difference. In the MMJ cell, the current flows in series through both the top and bottom junctions. Thus, a lateral mismatch in top and bottom junction currents requires a lateral current flow between the junctions to complete the series circuit. The lateral current flow involves a power loss due to relatively high resistance in the lateral layers between the junctions.

Figure 4:
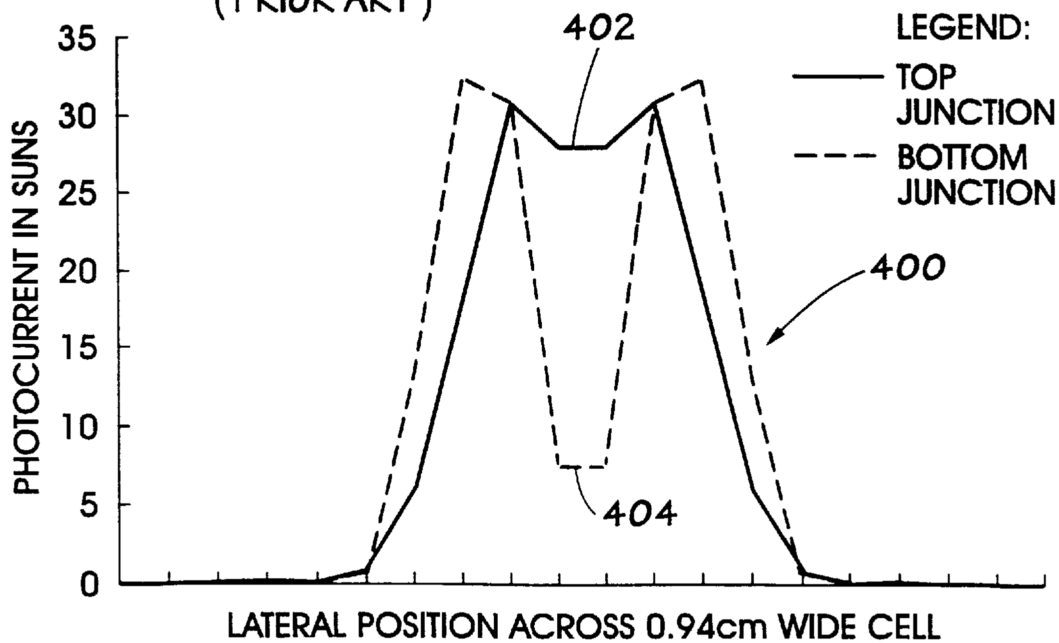
FIG. 4 illustrates a graphical representation of top and bottom junction currents as a function of lateral position across the MMJ cell of FIG. 2.

Turning now to FIG. 4, illustrated is a graphical representation, generally designated 400, of top and bottom junction currents as a function of lateral position across the MMJ cell of FIG. 2 (a "photocurrent profile"). FIG. 4 shows most dramatically differences in top and bottom junction current toward the center of the representation 400, where a significant distance separates the point 402 from the point 404 and, to a lesser extent, to either side of the points 402, 404.

Figure 5:
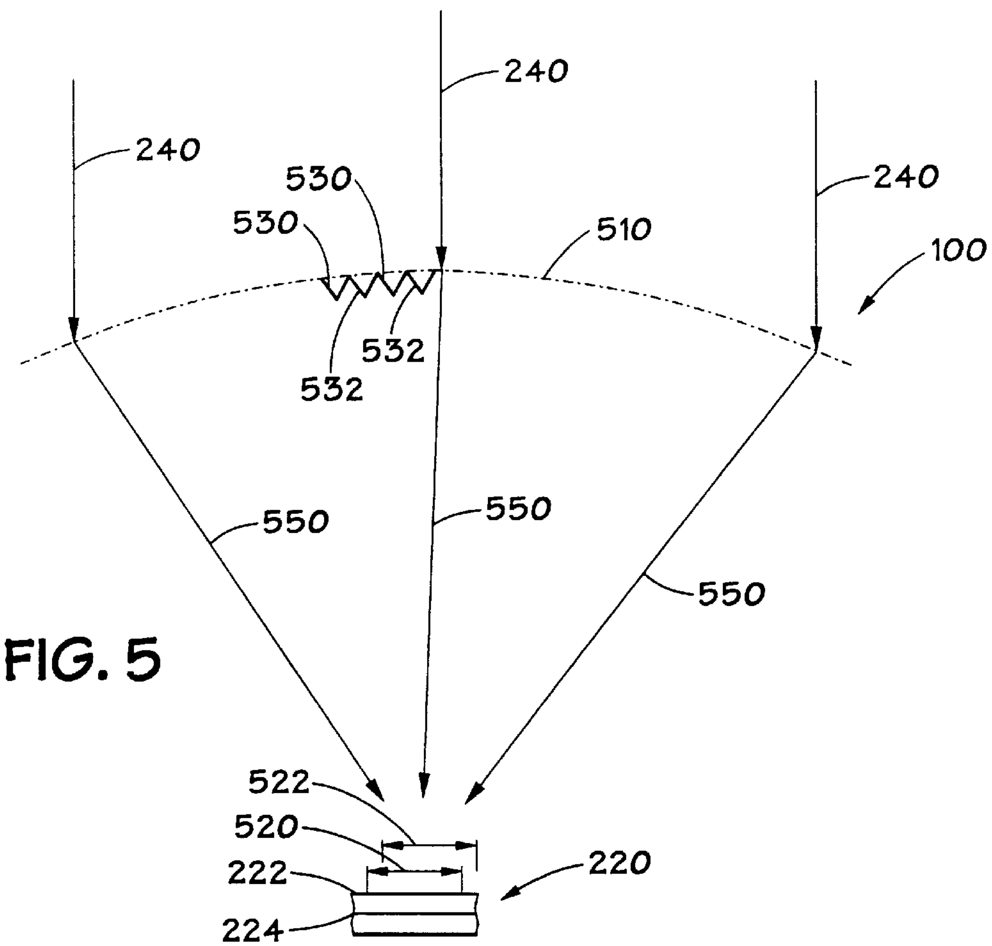
FIG. 5 illustrates a schematic diagram of a color-mixing lens of the present invention operating in the line-focus concentrator of FIG. 1.

Turning now to FIG. 5, illustrated is a schematic diagram of a color-mixing lens 510 of the present invention operating in the line-focus concentrator 100 of FIG. 1. The lens 510 comprises a first plurality of prisms 530 and a second plurality of prisms 532 that receive rays 240 of broad spectrum light from a source (not shown). As with FIG. 2, it is assumed that the source is sufficiently distant from the lens 510 that the rays 240 of light are essentially parallel, a condition that is safely taken to be true when the source of light is the sun. Individual ones of the first plurality of prisms 530 refract and chromatically disperse the rays 240 toward a target cell 220, resulting in the projection of rays 550 ("refracted rays") that radiate toward a first plurality of locations 520 spanning an active-width of the target cell 220. The first plurality of prisms 530 are illustrated as being of a conventional red-edge design; they place infrared photons emanating in rays 240 from the edge of the source (not shown) at edge of the active-width of the target cell 220 when the largest source-pointing error is present. The red-edge approach maximizes full spectrum photon collection while insuring the longer wavelength photons are all collected and by providing the widest possible target area for the shorter wavelength photons, which are more strongly refracted toward the opposite edge of the cell.

The second plurality of prisms 532 are illustrated as being of a red-shifted design; they refract and chromatically disperse the rays 240 toward a second plurality of locations 522 that likewise span an active-width of the target cell. However, the first and second plurality of locations 520, 522 only partially merge; they are shifted with respect to one another to cause the light projected thereon by the first and second plurality of prisms 530, 532, respectively, to mix. Those skilled in the art should understand, however, that the present invention is not limited to red-edge and red-shifted designs for its respective pluralities of prisms 530, 532. Rather, any combination of prisms that results in color mixing is within the broad scope of the present invention.

The first and second pluralities of prisms 530, 532 are illustrated as being of uniform height (about 4 mil in one embodiment) but having varied angles to aim the rays 550 toward the first and second pluralities of locations 520, 522, respectively.

In other embodiments of the present invention, the relative indices of refraction of the material constituting the first and second pluralities of prisms 530, 532 may be varied.

The first and second pluralities of prisms 530, 532 preferably alternate, such the first plurality of prisms 530 are either odd or even-numbered and the second plurality of prisms 532 are oppositely-numbered. More preferably, the second plurality of prisms 532 (illustrated as being red-shifted) refract incident photons by an amount equivalent to an increase in refractive index of 0.01, the color mixing stroke shown in FIG. 3. However, other 5 degrees of separation between the first and second pluralities of prisms 530, 532 are within the broad scope of the present invention.

A continuous, high-throughput production process has been developed from manufacturing the silicone lens from space-qualified material (commercially available from Dow Corning, item number 93-500). Two hundred and twenty micron-thick Fresnel lens material may be manufactured and delivered in rolls, typically 150-meters long. An 80-micron thick, ceria-doped micro-sheet superstrate may be laminated to the silicone lens to provide structural support and ultraviolet radiation protection for the lens. For typical space applications, the primary lens provides 90% optical efficiency at 10X concentration with a sun-pointing error tolerance of ±2° about the critical axis.

Again, the target cell 220 is illustrated as being an MMJ, with a top junction 222 and a bottom junction 224. As before, the top and bottom junctions 222, 224 absorb light of different frequencies. Thus, the refracted rays 550 impinge on the target cell 220, striking the top junction 222 first. The top junction 222 absorbs photons in the refracted rays 550 of the appropriate frequency range and passes all other photons through to the bottom junction 224. When the photons strike the bottom junction 224, those of the appropriate frequency range are absorbed. Any unabsorbed photons in the refracted rays 550 pass through the remainder of the target cell 220. Depending upon the number of photons absorbed in each of the top and bottom junction 222, 224, each junction develops an electrical current distribution of a given magnitude across the cell.

Thus, each odd-numbered prism places the center of the bottom junction current generation distribution on top of the center of the top junction current distribution for the proceeding even-numbered prism.

This approach is analogous to painting a wall with two spray cans, one red and one blue. If the cans are taped together and the buttons pushed simultaneously, a red spot and a blue spot will be formed with the spot separation corresponding to the distance between the center of the cans. If the cans are then moved laterally by this same distance, and the buttons are pushed simultaneously again, there will be three spots: a red one, a purple one (containing mixed red and blue paint) and a blue one. If this shifting process is repeated over and over several hundred times (corresponding to several hundred prisms in each half of a typical Fresnel lens), about half of the red paint will be well mixed with about half of the blue paint in the purple spot in the center. The other half of each colored paint will be unmixed. This simple approach provides significant current mixing.

Figure 6:
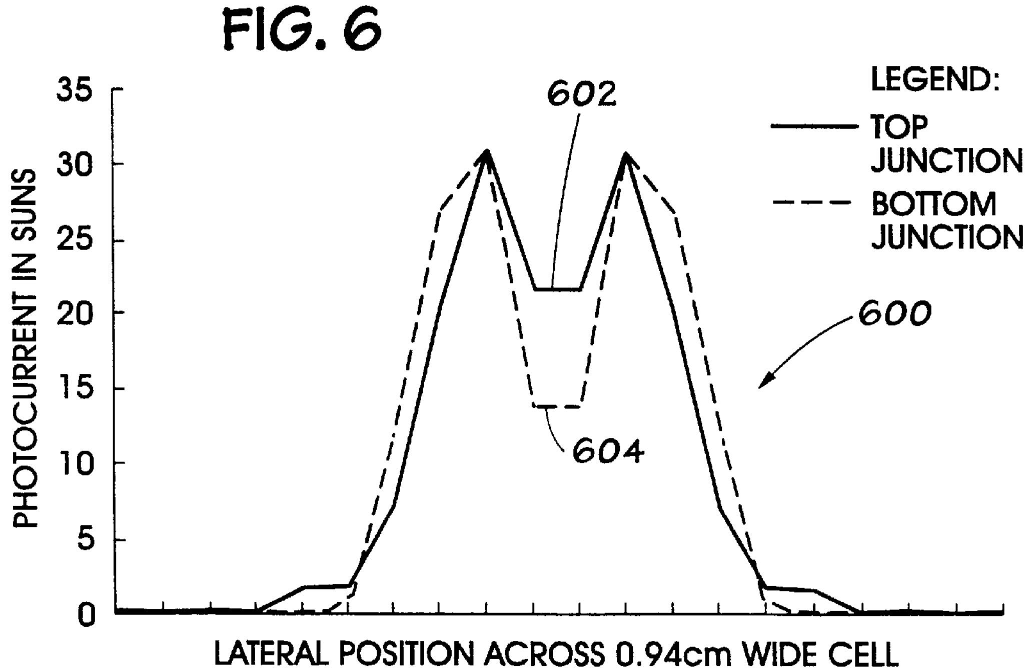
FIG. 6 illustrates a graphical representation of top and bottom junction currents as a function of lateral position across the MMJ cell of FIG. 5.

Turning now to FIG. 6, illustrated is a graphical representation, generally designated 600, of top and bottom junction currents as a function of lateral position across the MMJ cell 220 of FIG. 5. FIG. 6 should be compared to FIG. 4 to yield an understanding of the degree to which the color-mixing lens of the present invention decreases lateral inter-junction currents. The points 602, 604 are now significantly closer together, indicating that inter-junction currents toward the center of the MMJ cell 220 are substantially reduced.

Figure 7:
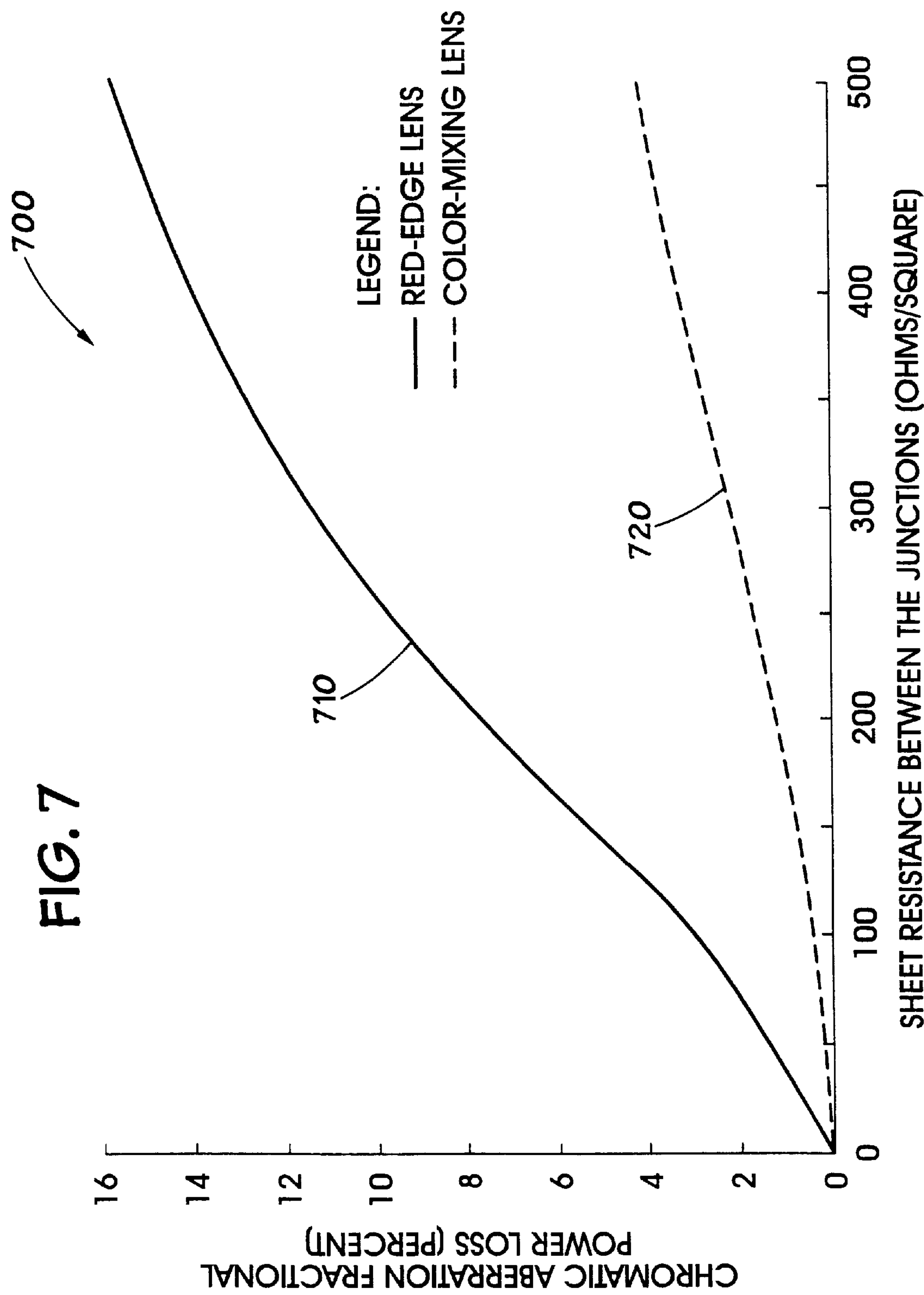
FIG. 7 illustrates a graphical representation of power loss due to chromatic aberration for a prior art lens (such as that of FIG. 2) compared with the color-mixing lens of the present invention (such as that of FIG. 5).

Turning now to FIG. 7, illustrated is a graphical representation, generally designated 700, of power loss due to chromatic aberration for a prior art lens (such as the lens 210 of FIG. 2) compared with the color-mixing lens of the present invention (such as the lens 510 of FIG. 5).

To illustrate the resulting increase in MMJ cell power output brought about by the present invention, a sophisticated model has recently been developed accurately to calculate the power loss due to chromatic aberration. This new model provides the results shown in FIG. 7, for both the color-mixing lens (a line 720) and prior art lens (a line 710) design. Note that the chromatic aberration power loss varies non-linearly with the lateral sheet resistance of the conductive layers between the junctions in the MMJ cell structure. The chromatic aberration power loss is much lower for the color-mixing lens (the line 720), because the top and bottom junction currents are more closely matched, and lateral current flow is thereby reduced.

From the above, it is apparent that the present invention provides, for use in a concentrator system, a color-mixing lens, including: (1) a light-transmissive substrate that receives broad spectrum light from a source, (2) a first plurality of prisms, located on the substrate, that refract and chromatically disperse the light received therein toward a first plurality of locations on an active region of a target cell and (3) a second plurality of prisms located on the substrate that refract and chromatically disperse the light received therein toward a second plurality of locations on the active region, relative dimensions of the first and second pluralities of prisms being preselected to cause the chromatically dispersed light to mix and thereby increase the power output of the target cell.

Although the present invention has been described in detail, those skilled in the art should understand that they can make various changes, substitutions and alterations herein without departing from the spirit and scope of the invention in its broadest form.

What is claimed is:

1. For use in a concentrator system, a color-mixing lens, comprising:

a light-transmissive substrate that receives broad spectrum light from a source;

a first plurality of red-edge prisms, located on said substrate, that refract and chromatically disperse said light received therein toward a first plurality of locations on an active region of a target cell; and a second plurality of red-shifted prisms, located on said substrate, that refract and chromatically disperse said light received therein toward a second plurality of locations on said active region, said first and second pluralities of locations partially merging to cause said chromatically-dispersed light to mix.

2. The lens as recited in claim 1 wherein said light-transmissive substrate is composed of silicone.

3. The lens as recited in claim 1 wherein said first and second pluralities of locations are spatially offset to minimize lateral inter-junction current in said target cell.

4. The lens as recited in claim 3 wherein said first and second pluralities of locations are spatially offset to overlap median-current photons for junctions in said target cell.

5. The lens as recited in claim 1 wherein said first and second pluralities of prisms alternate on said substrate.

6. The lens as recited in claim 1 wherein said target cell is a monolithic multi-junction (MMJ) cell.

7. The lens as recited in claim 1 wherein said light is white light.

8. The lens as recited in claim 1 wherein said first and second pluralities of prisms are integral with said substrate.

9. A method of manufacturing a color-mixing lens for use in a concentrator system, comprising the steps of:

forming a light-transmissive substrate that receives broad spectrum light from a source;

forming a first plurality of red-edge prisms on said substrate that refract and chromatically disperse said light received therein toward a first plurality of locations on an active region of a target cell; and forming a second plurality of red-shifted prisms on said substrate that refract and chromatically disperse said light received therein toward a second plurality of locations on said active region, said first and second pluralities of locations partially merging to cause said chromatically-dispersed light to mix.

10. The method as recited in claim 9 wherein said light-transmissive substrate is composed of silicone.

11. The method as recited in claim 9 wherein said first and second pluralities of locations are spatially offset to minimize lateral inter-junction current in said target cell.

12. The method as recited in claim 11 wherein said first and second pluralities of locations are spatially offset to overlap median-current photons for junctions in said target cell.

13. The method as recited in claim 9 wherein said first and second pluralities of prisms alternate on said substrate.

14. The method as recited in claim 9 wherein said target cell is a monolithic multi-junction cell.

15. The method as recited in claim 9 wherein said light is white light.

16. The method as recited in claim 9 wherein said steps of forming are performed by molding said substrate and prisms.

17. A method of operating a concentrator system that receives broad spectrum light from a source, comprising the steps of:

refracting and chromatically dispersing a first portion of said broad spectrum light through a first plurality of red-edge prisms mounted on a light-transmissive substrate toward a first plurality of locations on an active region of said target cell; and refracting and chromatically dispersing a second portion of said broad spectrum light through a second plurality of red-shifted prisms mounted on said light-transmissive substrate toward a second plurality of locations on said active region, said first and second pluralities of locations partially merging to cause said chromatically-dispersed light to mix.

18. The method as recited in claim 17 wherein said light-transmissive substrate is composed of silicone.

19. The method as recited in claim 17 wherein said first and second pluralities of locations are spatially offset to minimize lateral inter-junction current in said target cell.

20. The method as recited in claim 19 wherein said first and second pluralities of locations are spatially offset to overlap median-current photons for junctions in said target cell.

21. The method as recited in claim 17 wherein said first and second pluralities of prisms alternate on said substrate.

22. The method as recited in claim 17 wherein said target cell is a monolithic multi-junction cell.

23. The method as recited in claim 17 wherein said light is white light.

24. The method as recited in claim 17 wherein said first and second pluralities of prisms are integral with said substrate.

25. A lens for focusing solar radiation onto at least one multi-junction photovoltaic cell where said lens defines a focal plane, said lens including a plurality of prisms wherein at least two of said prisms are disposed in substantially the same region of said lens and are configured to microscopically focus different wavelengths of solar radiation to the same location in said focal plane.

26. The lens of claim 25 wherein the multi-junction cell comprises a monolithic multi-junction photovoltaic device.

27. The lens of claim 25 where each of said prisms define an alternating focal pattern from that of adjacent prisms such that a given prism will focus light of a significantly different wavelength from that light focused by any adjacent prism.

28. The lens of claim 27 where the lens is comprised of:

a light-transmissive substrate which receives broad spectrum light from a source;

a first plurality of prisms located on the substrate which refract and chromatically disperse the light received therein toward a first plurality of locations on an active region of a target cell; and a second plurality of prisms located on the substrate which refract and chromatically disperse the light received therein toward a second plurality of locations on the active region.

29. A Fresnel lens for focusing solar radiation onto a photovoltaic receiver where said lens comprises a plurality of microscopic prisms where every other of said prisms focuses an overlapping light pattern of a substantially different wavelength from that of the adjacent prism onto said receiver.

30. The Fresnel lens of claim 29 where the receiver comprises at least one monolithic multi-junction cell.

31. The lens of claim 29 where the lens is comprised of:

a light-transmissive substrate that receives broad spectrum light from a source;

a first plurality of prisms located on the substrate that refract and chromatically disperse the light received therein toward a first plurality of locations on an active region of a target cell; and a second plurality of prisms located on the substrate that refract and chromatically disperse the light received therein toward a second plurality of locations on the active region.

32. A method of creating a high performance light concentrator system comprising the steps of:

positioning a Fresnel lens proximate at least one multi-junction photovoltaic cell so as to define a focal plane; and integrating into said lens on an alternating basis a plurality of microscopic prisms such that a given prism focuses light of a significantly different wavelength from that formed by adjacent prisms onto the same location on said photovoltaic cell.

33. The method of claim 32 further including the step of including a means to cool the photovoltaic cell.

* * * * *

UNITED STATES PATENT AND TRADEMARK OFFICE
CERTIFICATE OF CORRECTION

PATENT NO. : 6,031,179
DATED : February 29, 2000
INVENTOR(S) : Mark J. O'Neill

It is certified that error appears in the above-identified patent and that said Letters Patent is hereby corrected as shown below:

At column 5, line 33, after "1.430," please delete "6."

Signed and Sealed this

Twenty-seventh Day of February, 2001

Attest:

NICHOLAS P. GODICI

*Attesting Officer* *Acting Director of the United States Patent and Trademark Office*